United States Patent
Adams et al.

(10) Patent No.: US 7,388,773 B2
(45) Date of Patent: Jun. 17, 2008

(54) RANDOM ACCESS MEMORY WITH A PLURALITY OF SYMMETRICAL MEMORY CELLS

(75) Inventors: Chad A. Adams, Byron, MN (US);
Torsten Mahuke, Stuttgart (DE);
Juergen Pille, Stuttgart (DE); Oto Wagner, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/462,380

(22) Filed: Aug. 4, 2006

(65) Prior Publication Data
US 2007/0041240 A1    Feb. 22, 2007

(30) Foreign Application Priority Data
Aug. 22, 2005    (EP)    .................. 05107691

(51) Int. Cl.
*G11C 11/00*    (2006.01)

(52) U.S. Cl. .................. 365/154; 365/72; 365/190

(58) Field of Classification Search ................ 365/154, 365/72, 190
See application file for complete search history.

(56) References Cited

U.S. PATENT DOCUMENTS

| | | | |
|---|---|---|---|
| 6,249,471 B1 * | 6/2001 | Roy | ........................... 365/207 |
| 6,356,484 B2 * | 3/2002 | Dosaka et al. | ......... 365/189.01 |
| 6,434,661 B1 * | 8/2002 | Konishi et al. | ............. 711/105 |

* cited by examiner

*Primary Examiner*—Hoai V. Ho
*Assistant Examiner*—Kretelia Graham
(74) *Attorney, Agent, or Firm*—W. Riyon Harding

(57) ABSTRACT

The invention proposes a Random Access Memory (1) with a plurality of symmetrical memory cells (2) which are connected in groups to complementary bit lines (blc, blt), and the complementary bit lines (blc, blt) are coupled through a cross coupled device (31, 32), and the groups of memory cells are connected to complementary global data lines (data_c, data_t) used to provide data to a selected cell of the group of memory cells. The Random Access Memory is characterized in that switches (33, 34) are provided that deactivate the cross coupled device, wherein the switches (33, 34) are driven by the complementary global data lines (data_c, data_t). The invention relates further on to a computer comprising such a Random Access Memory.

2 Claims, 4 Drawing Sheets

(State of the Art)

(State of the Art)

RANDOM ACCESS MEMORY WITH A PLURALITY OF SYMMETRICAL MEMORY CELLS

CROSS REFERENCES TO RELATED APPLICATIONS

This application is related to German Patent Application No. 05107691.7, filed Aug. 22, 2005, now abandoned.

BACKGROUND OF THE INVENTION

1. Field of the Invention

The present invention relates to Random Access Memory with a plurality of symmetrical memory cells which are connected in groups to complementary bit lines, which complementary bit lines are coupled through a cross coupled device.

2. Background of the Invention

A memory may include a plurality of symmetrical Random Access Memory (SRAM) cells arranged in columns and rows. Each SRAM cell may store a bit of data. To read a value stored in a cell or to write a value into a cell, a column including the cell may be selected, and a row including the cell may be selected.

Symmetrical memory cells as they are used in SRAMs are built up with two nodes wherein each node is connected to one line of a pair of a complementary bit line. FIG. 1 shows such a well known and common architecture. The memory cell 2 is connected with its two nodes tru and cmp to a complementary bit line with a pair of lines blc and blt for column selection. The row selection signal line is named in this example wl. To avoid faults during read or write processes through effects discussed by FIG. 2 cross coupled devices are used in between the pair of complementary bit line blc and blt. The known cross coupled devices are built up by a pair of transistors 31, 32 that are coupling the pair of bit lines blc and blt in the shown manner.

FIG. 2 explains parasitic effects that occur. On top of FIG. 2 a cell transfer device of an unselected, and therefore switched off, cell is depicted.

Caused by gate impurities from processing or device thresholds close to or below 0 it is possible that conduct leakage occurs at the transfer device 5 of a memory cell connected to the bit line BLT. This leakage is shown as resistor 51. Many closed cells are usually connected to a bit line what adds these negative effects.

The device at the bottom of FIG. 2 depicts a resulting resistor 52 which represents leakage to devices of circuitry connected to bit other than the memory cells.

The device in the middle of FIG. 2 depicts the part of a selected cell (wl=HIGH) which is in a state driving bit high. The transfer device 5 in series with the pull up device 6 has to compensate the leakage shown by arrow 53. At a certain amount of leakage the compensation is not sufficient resulting in that the read signal is too weak. In absence of any cross coupled devices this situation causes yield loss. Though the probability of leakage defects is low the very large amount of memory cells connected to a bit line makes the loss significant and therefore cross coupled devices as shown in FIG. 1 are implemented. They can compensate a large amount of leakage.

As a negative effect cross coupled devices cause disturbances when writing a memory cell.

During write signals, which are distributed by global data lines (i.e. for writing data_c and data_t), it may occur that the complementary bit lines bit and blc are set later than wl selects a cell. This causes the bit lines to be biased like in read operation. The cross coupled devices amplify the unwanted read signal and disturb the write operation when it has to set bit and blc in the opposite direction.

This effect causes that write operations are performed wasting time for security reasons.

SUMMARY OF THE INVENTION

It is therefore an object of the invention to provide a Random Access Memory with symmetrical memory cells wherein the performance is increased by improving the technique of used cross coupled devices.

The object of the invention is met by a Random Access Memory with a plurality of symmetrical memory cells which are connected in groups to complementary bit lines, and the complementary bit lines are coupled through a cross coupled device, and the groups of memory cells are connected to complementary global data lines used to provide data to a selected cell of the group of memory cells. The Random Access Memory is characterized in that switches are provided that deactivate the cross coupled device, wherein the switches are driven by the complementary global data lines.

In a preferred embodiment of the invention said cross coupled device comprises a first coupling transistor which gate is connected to a first line of the complementary bit lines, which source is connected to a power source of a defined signal level and which drain is connected to the second line of the complementary bit lines, and that the cross coupled device comprises a second coupling transistor which gate is connected to the second line of the complementary bit lines, which source is connected to a power source of a defined signal level and which drain is connected to the first line of the complementary bit lines.

The switches are a pair of transistors according to another preferred embodiment.

In another preferred embodiment the first transistor is connected in series in between the source of the first coupling transistor and the power source of a defined signal level or is connected in series in between the drain of the source of the first coupling transistor and the second line of the complementary bit lines.

In another preferred embodiment the second transistor is connected in series in between the source of the second coupling transistor and the power source of a defined signal level or is connected in series in between the drain of the second coupling transistor and the first line of the complementary bit lines.

BRIEF DESCRIPTION OF THE DRAWINGS

The present invention and its advantages are now described in conjunction with the accompanying drawings.

DETAILED DESCRIPTION

Figure 1:
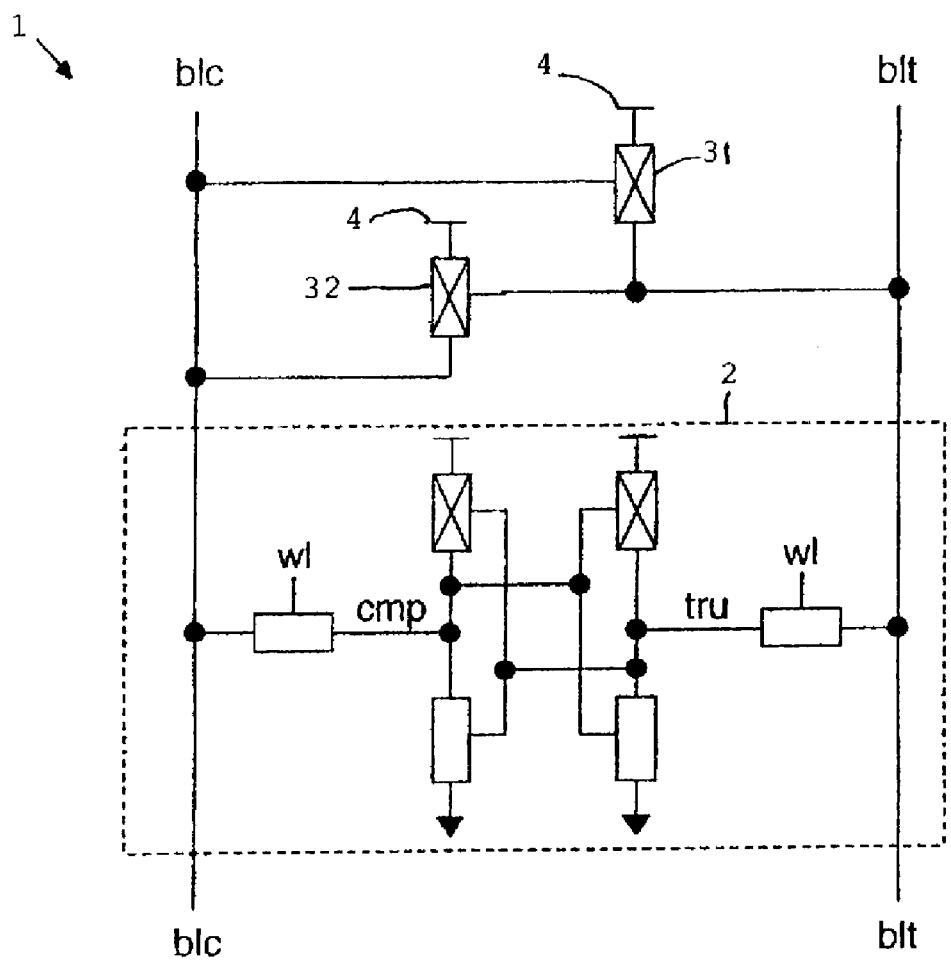
FIG. 1 shows a scheme of a Random Access Memory with a cross coupled device according to the state of the art.
Figure 2:
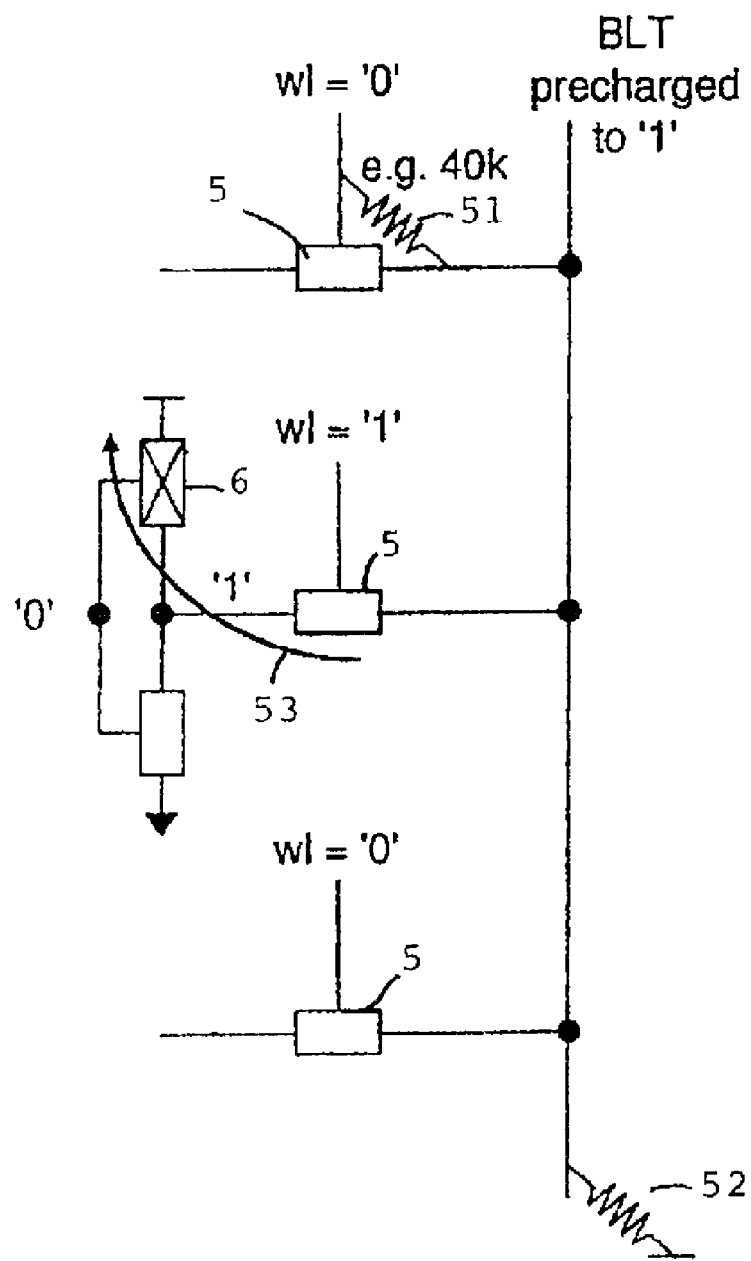
FIG. 2 shows a scheme of the most disturbing effects by the architectures according to the state of the art.
Figure 3:
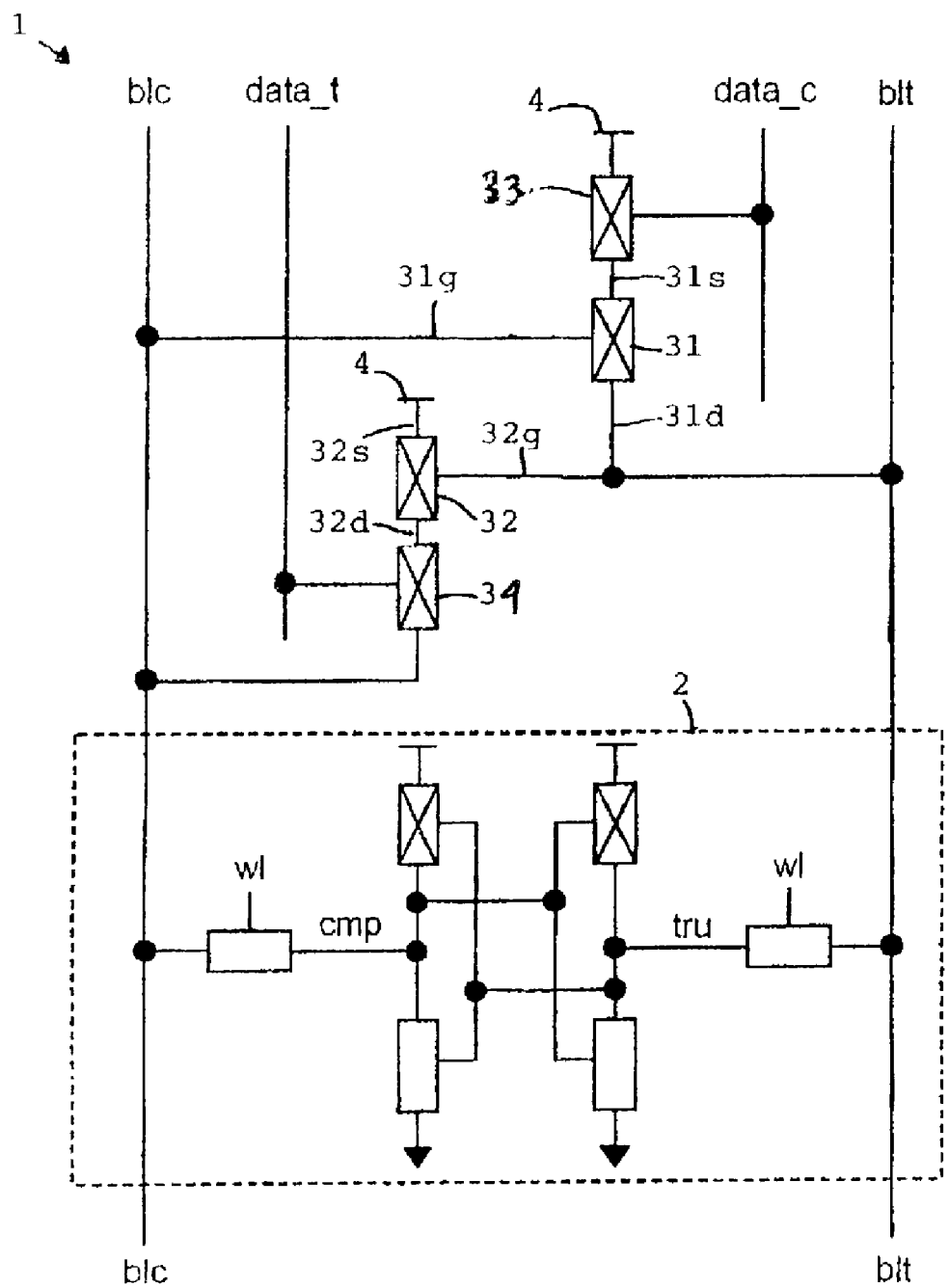
FIG. 3 shows a scheme of a Random Access Memory with an improved cross coupling device according to the invention.

FIG. 3 depicts a scheme of a Random Access Memory 1 with a plurality of symmetrical memory cells 2 with a cross coupled device 31, 32, 33 and 34 according to the invention.

The memory cell 2 is connected with its two nodes tru and cmp to a complementary bit line with a pair of lines blc and blt for column selection. The row selection signal line is named in this example wl.

Between the two bit lines blc and blt a cross coupled device with the transistors 31 and 32 is switched coupling the pair of bit lines. Switches 33, 34 incorporated, for example, by transistors deactivate the cross coupled device, wherein they are driven by the complementary global write data lines (data_c, data_t).

Figure 4:
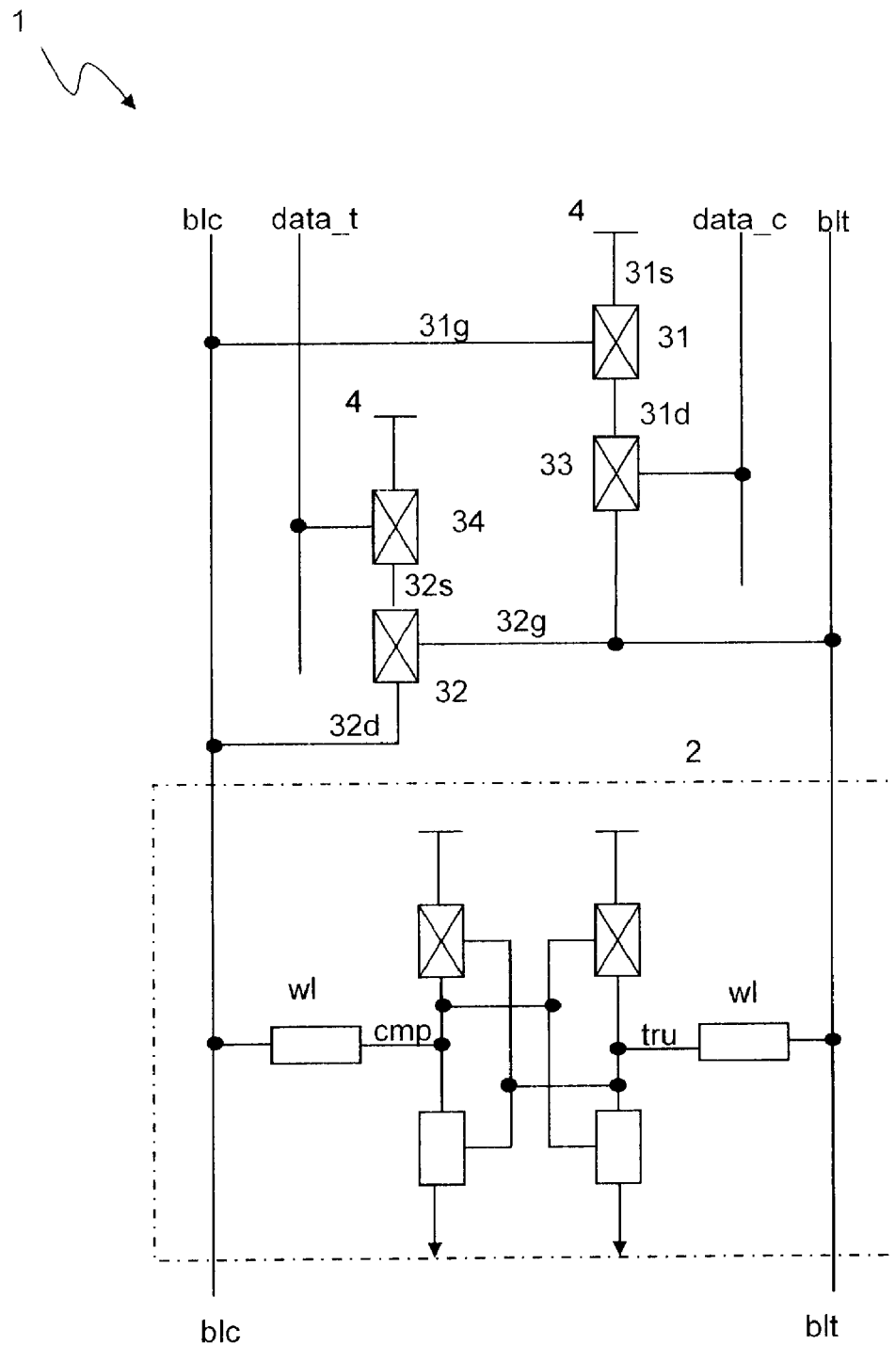
FIG. 4 shows a scheme of a random Access Memory with an improved cross coupling device according to another embodiment of the invention.

In the first depicted example shown in FIG. 3, the first switch 33 is connected in series in between the source 31s of the first coupling transistor 31 and the power source 4 of a defined signal level (HIGH). The gate of the first coupling transistor (31g) is coupled to first line (blc) of complimentary bit lines blc and blt. The second switch 34 is connected in series in between the drain (32d) of the second coupling transistor (32) and the first line (blc) of the complementary bit lines. In a second embodiment, shown in FIG. 4, the second switch 34 is connected in series in between the source (32s) of the second coupling transistor (32) and the power source (4) of a defined signal level (HIGH) while the gate of the second coupling transistor (32g) is coupled to the second bit line (blt); and the first coupling switch 33 is coupled between the drain of the first coupling transistor 31 and the gate of the second coupling transistor (32g). The first switch (33) and a second switch (34) are provided to deactivate the cross coupled device when they are driven by the complementary global data lines (data_c, data_t).

For both switching transistors a placement at the source or gate side of the transistors of the cross coupled device is possible.

During standby the column select bit lines blc and blt are charged up.

During a read operation read either line (e.g. blt) is pulled down by the selected cell. The other line (e.g. blc) is kept high by switch 33 of the cross coupled device.

During a write operation either column select bit line (e.g. blc) of the pair is forced down, the other one (e.g. blt) is kept high by switch 34 the cross coupled device.

In a hierarchical approach, which is also common, groups of cells within a column have local isolated column selects. A row select wl selects one cell within a column and therefore only one group in a column is active. A read signal of a selected cell is amplified by a circuit owned by each group. The signal is transferred to a global read data line serving all groups of cells within a column. Write information is supplied on global data lines, one pair with true and complement data per column. Each group of cells within a column is connected to this pair by its own adapter which drives the column select lines blc and blt of this group of cells during write.

The global data lines are named data_t and data_c. They are at down level during read and also for unselected columns during write.

Selecting a column for writing a '1' to the memory cell 2 data_t is forced up and data_c down. The signal are inverse when writing a '0' to the memory cell 2.

The signal on the global data lines data_t and data_c is used to disable the coupling transistors 31 and 32 of the cross coupled device on the column select lines of the groups of cells within that column which is selected for write by driving switches 33 and 34 accordingly.

The negative effects caused by the cross coupled device during write processes are diminished. There are no additional signals and only minimal additional hardware needed which can be integrated into existing architectures without the need to redesign them on a larger scale.

What is claimed is:

1. A Random Access Memory (1) with a plurality of symmetrical memory cells (2) which are connected in groups of memory cells (2) to complementary bit lines (blc, blt), and said complementary bit lines (blc, blt) are coupled through a cross coupled device (31, 32), said groups of memory cells are connected to complementary global data lines (data_c, data_t) used to provide data to a selected cell of the groups of memory cells, a first switch (33) and a second switch (34) are provided that deactivate the cross coupled device, wherein the first and second switch are driven by the complementary global data lines (data_c, data_t);

the cross coupled device comprises a first coupling transistor (31) the gate (31g) of which is connected to a first line (blc) of the complementary bit lines, and the source (31s) of which is connected to a power source (4) of a defined signal level (HIGH) and the drain (31d) of which is connected to a second line (blt) of the complementary bit lines, and that the cross coupled device (31, 32) comprises a second coupling transistor (32) the gate (32g) of which is connected to the second line (blt) of the complementary bit lines, the source (32s) of which is connected to the power source (4) of a defined signal level (HIGH) and the drain (32d) of which is connected to the first line (blc) of the complementary bit lines;

the first switch (33) is a first transistor and the second switch (34) is a second transistor; and the first transistor (33) is connected in series in between the source (31s) of the first coupling transistor (31) and the power source (4) of a defined signal level (HIGH) or is connected in series in between the drain (31d) of the first coupling transistor (31) and the second line (blt) of the complementary bit lines.

2. A Random Access Memory (1) with a plurality of symmetrical memory cells (2) which are connected in groups of memory cells (2) to complementary bit lines (blc, blt), and said complementary bit lines (blc, blt) are coupled through a cross coupled device (31, 32), said groups of memory cells are connected to complementary global data lines (data_c, data_t) used to provide data to a selected cell of the groups of memory cells, a first switch (33) and a second switch (34) are provided that deactivate the cross coupled device, wherein the first and second switch are driven by the complementary global data lines (data_c, data_t);

the cross coupled device comprises a first coupling transistor (31) the gate (31g) of which is connected to a first line (blc) of the complementary bit lines, and the source (31s) of which is connected to a power source (4) of a defined signal level (HIGH) and the drain (31d) of which is connected to a second line (blt) of the complementary bit lines, the cross coupled device (31, 32) comprises a second coupling transistor (32) the gate (32g) of which is connected to the second line (blt) of the complementary bit lines, the source (32s) of which is connected to the power source (4) of a defined signal level (HIGH) and the drain (32*d*) of which is connected to the first line (blc) of the complementary bit lines;

the first switch (33) is a first transistor and the second switch (34) is a second transistor; and the second transistor (34) is connected in series in between the source (32*s*) of the second coupling transistor (32) and the power source (4) of a defined signal level (HIGH) or is connected in series in between the drain (32*d*) of the second coupling transistor (32) and the first line (blc) of the complementary bit lines.

* * * * *

UNITED STATES PATENT AND TRADEMARK OFFICE
CERTIFICATE OF CORRECTION

| | |
|---|---|
| PATENT NO. | : 7,388,773 B2 |
| APPLICATION NO. | : 11/462380 |
| DATED | : June 17, 2008 |
| INVENTOR(S) | : Chad A. Adams et al. |

It is certified that error appears in the above-identified patent and that said Letters Patent is hereby corrected as shown below:

Title page, item [75] inventor - Torsten Mahuke which needs to be changed to Torsten Mahnke.

Signed and Sealed this

Twenty-third Day of December, 2008

JON W. DUDAS
*Director of the United States Patent and Trademark Office*